United States Patent [19]

Pierrat

[11] Patent Number: 5,405,721
[45] Date of Patent: Apr. 11, 1995

[54] PHASE-SHIFTING LITHOGRAPHIC MASKS HAVING PHASE-SHIFTING LAYERS OF DIFFERING COMPOSITIONS

[75] Inventor: Christophe Pierrat, Basking Ridge, N.J.

[73] Assignee: AT&T Corp., Murray Hill, N.J.

[21] Appl. No.: 164,735

[22] Filed: Dec. 8, 1993

Related U.S. Application Data

[63] Continuation of Ser. No. 931,621, Aug. 18, 1992, abandoned.

[51] Int. Cl.$^6$ .............................................. G03C 5/00
[52] U.S. Cl. ...................................... 430/5; 430/320; 430/321
[58] Field of Search ............................ 430/5, 320, 321

[56] References Cited

U.S. PATENT DOCUMENTS 5,144,362  9/1992  Kamon et al. .................... 355/71
5,147,763  9/1992  Kamitakahara .................... 430/5

OTHER PUBLICATIONS

Hasegawa, N. et al., "Submicron Photolithography Using Phase-Shifting Mask," Fourth Hoya Photomask Symposium, Japan. 1991.

*Primary Examiner*—Mark A. Chapman
*Attorney, Agent, or Firm*—David I. Caplan

[57] ABSTRACT

A phase-shifting lithographic mask, for use in conjunction with optical radiation of wavelength $\lambda$, has a transparent substrate upon which are successively located a bottom $(2m+1)\pi$ radian phase-shifting layer and a patterned top $(2n+1)\pi$ radian phase-shifting layer each having at least approximately the same refractive index at the wavelength $\lambda$ as that of the substrate. A more finely patterned, opaque chromium layer is located on the patterned top phase-shifting layer. The bottom phase-shifting layer is chemically different from both the substrate and the top layer, in order to provide either etch-stopping or end-point etch detection during subsequent dry ion beam millings—as with gallium ions—of either or both of the layers, for the purpose of mask repair. For example, the substrate is quartz (silicon dioxide), the bottom phase-shifting layer is calcium fluoride, and the top phase-shifting layer is silicon dioxide. Remnants of the gallium then can be removed from both the exposed portions of the substrate and of the bottom layer—by means of successive etchings, for example, with HF and HCl, respectively, for respective prescribed time intervals having a ratio such that the relative phase shifts of the substrate and both phase-shifting layers are not disturbed by the respective etchings.

9 Claims, 2 Drawing Sheets

PHASE-SHIFTING LITHOGRAPHIC MASKS HAVING PHASE-SHIFTING LAYERS OF DIFFERING COMPOSITIONS

This application is a continuation of application Ser. No. 07/931621, filed on Aug. 18, 1992, now abandoned.

TECHNICAL FIELD

This invention relates to lithography, especially optical lithography, such as that used for fabricating semiconductor integrated circuit and other devices. More particularly the invention relates to phase-shifting mask structures and to methods of making such structures, for use in lithography systems for fabricating such devices. These masks are also called "reticles" particularly when used in optical systems having magnifications different from unity.

BACKGROUND OF THE INVENTION

FIG. 1 shows a typical optical lithographic fabrication system 100 for delineating features in a workpiece 120. Typically the workpiece comprises a semiconductor wafer (substrate), together with one or more layers of material(s) (not shown) located on a top major surface of the wafer. More specifically, monochromatic optical radiation of wavelength $\lambda$ emitted by an optical source 106, such as a mercury lamp, propagates through an aperture in an opaque screen 105, an optical collimating lens 104, a lithographic mask or reticle 103, and an optical focusing lens 102. The optical radiation emanating from the reticle 103 is focused by the lens 102 onto a photoresist layer 101 located on the top major surface of the workpiece 120. Thus, the pattern of the reticle 103—that is, its pattern of transparent and opaque portions—is focused on the photoresist layer 101. Depending upon whether this photoresist is positive or negative, when it is subjected to a development process, typically a wet developer, the material of the photoresist is removed or remains at and only at areas where the optical radiation was incident. Thus, the pattern of the mask is transferred to ("printed on") the photoresist layer 101. Subsequent etching processes, such as wet etching or dry plasma etching, remove selected portions of the workpiece 120. Portions of the workpiece 120 thus are removed from the top surface of the workpiece 120 at areas underlying those where the photoresist layer 101 was removed by the development process but not at areas underlying those regions where the photoresist remains. Alternatively, instead of etching the workpiece, impurity ions can be implanted into the workpiece 120 at areas underlying those where the photoresist layer was removed by the development process but not at areas underlying where the photoresist remains. Thus, the pattern of the mask 103—i.e., each feature of the mask—is transferred to the workpiece 120 as is desired, for example, in the art of semiconductor integrated circuit fabrication.

In fabricating such circuits, it is desirable, for example, to have as many transistors per wafer as possible. Hence, it is desirable to have as small a transistor or other feature size as possible, such as the feature size of a metallization stripe—i.e., its width W—or of an aperture in an insulating layer which is to be filled with metal, in order to form electrical connections, for example, between one level of metallization and other. Thus, for example, if it is desired to print the corresponding isolated feature having a width equal to W on the photoresist layer 101, a feature having a width equal to C must be located on the mask (reticle) 103. According to geometric optics, if this feature of width equal to C is a simple aperture in an opaque layer, then the ratio $W/C = m$, where $m = L2/L1$, and where m is known as the lateral magnification. When diffraction effects become important, however, the edges of the image become indistinct; hence the resolution of the features of the reticle 103, as focused on the photoresist layer and transferred to the workpiece, deteriorates.

In order to improve the resolution, in the prior art phase-shifting lithographic masks have been taught. A phase-shifting mask is used as the mask (or reticle) 103 in the system 100. Moreover, a phase-shifting mask comprises various regions that impart various phase shifts to the optical radiation that originates from the source 106 and propagates through the mask 103 in the system 103. More specifically, these phase-shifting masks have opaque and transparent regions. The transparent regions typically have at least two different thicknesses suitable for imparting at least two different phase shifts (each relative to the ambient atmosphere, typically air), typically equivalent to 0 and $\lambda$ radians, to the optical radiation (of wavelength $\lambda$) propagating through the mask when it is being used as the reticle 103. The expression for the phase shift of a layer is given by $(n-1)d$, where n denotes the refractive index of the layer, d denotes the thickness of the layer, and the refractive index of the ambient is assumed to be equal to unity.

In order to facilitate repair of a phase-shifting mask structure, a variety of such mask structures has been proposed in prior art. A typical such phase-shifting mask structure 200 is depicted in FIG. 2. The structure 200 is an extension of the concepts taught in a paper by N. Hasegawa et al., entitled "Submicron Photolithography using Phase-Shifting Mask-Shifter Defect Repair Method," published in Fourth Hoya Photomask Symposium, Japan. This structure 200 includes a transparent quartz substrate 10, a pair of transparent silicon dioxide bottom and top phase-shifter (phase-shifting) layers 7 and 9, respectively, and a patterned opaque chromium layer 13. The patterning of the opaque layer 13 is in accordance with the desired optical image on the photoresist layer 101. A bottom etching end-point detection layer 6 and top etch-stopping layer 8, each typically made of tin oxide, respectively, separate the quartz substrate 10 from the bottom phase-shifter layer 7, and the bottom phase-shifter layer 7 from the top phase-shifter layer 9. The phase-shift introduced by the top phase-shifting layer 9 is equal to $\pi$ radian; the sum of the phase shifts introduced by the bottom phase-shifting layer 7 and the bottom end-point detection layer 8 is also equal to $\pi$ radian.

The structure 200 contains protruding and indentation defect regions 21 and 22, respectively. The purpose of the bottom end-point detection layer 6 is to enable repair of the mask structure 200—insofar as the indentation defect region 22 is concerned—by a process of etching (ion milling) the defect region (and perhaps its neighborhood) down to the bottom end-point detection layer 6 without (undesirably) penetrating farther downward, as explained more fully below. The purpose of the top etch-stopping layer 8 is to enable patterning, as by anisotropic dry etching, of the top phase-shifter layer 9 without the etching undesirably penetrating down into the bottom phase-shifting layer 7. In addition, the top etch-stopping layer 8 can serve the function of end-point detection during repair of the mask structure 200—insofar as the protruding defect region 21 is concerned—by a process of etching (ion milling) without penetrating farther downward than the bottom surface of the defect region 21 itself.

In order to repair the mask structure 200—i.e., to remove unwanted phase-shifting effects caused by the defect regions 21 and 22—first the protruding defect region 21 can be removed, as by focused ion beam etching (ion milling) that scans the top surface of the top etch-stopping layer 8. The milling is terminated as soon as secondary ions or secondary electrons being emitted and detected during the ion milling begin to shift from those known to be emitted by the material of the defect region 21 to those known to be emitted by the material of the top etch-stopping layer 8. Then the indentation defect region 22 is removed by anisotropically (vertically) etching it, together with a neighborhood of it, through both the phase-shifting layers 9 and 7 as well as the top etch-stopping layer 8, down to the top surface of the bottom end-point detection layer 6 but not at all penetrating it. In this way, the resulting phase shift associated with the resulting hole penetrating through the bottom and top phase shifter layers 7 and 9 plus the top etch-stopping layer 8 is equal to $\pi$ radian+$\pi$ radian=$2\pi$ radian—i.e., equivalent to a zero phase shift, as is desired.

The foregoing technique suffers from one or more of the following shortcomings. First, the optical absorptions by the top etch-stopping layer 8 and of the bottom end-point detection layer 6 can be undesirably high, especially if the wavelength $\lambda$ is in the deep ultraviolet (typically the 248 nm optical wavelength emitted by an excimer laser source), and hence the overall optical transmission of the structure 200 can become undesirably low. Second, the refractive index discontinuities at various interfaces between the different materials of the various layers in the structure 200 can give rise to undesirable high-amplitude optical reflections, which again can result in undesirably low overall optical transmission. Third, the complexity of fabrication, owing to the etch-stopping layer 8 and the bottom end-point detection layer 6, can undesirably add to production costs, and also can lower production yields because of unwanted pinholes that can exist in these layers. Therefore, it would be desirable to have a phase-shifting mask structure for use in the system 100 that mitigates the shortcoming of this prior art.

SUMMARY OF THE INVENTION

This invention provides, in one embodiment thereof, a phase-shifting lithographic mask structure for use in an optical lithographical system utilizing optical radiation of wavelength $\lambda$, comprising:

(a) a transparent substrate having a major surface;

(b) a first (bottom) transparent layer of first material that is chemically different from that of the substrate, located on and contiguous with the major surface;

(c) a second (top) transparent layer of second material that is chemically different from that of the first material, located on and contiguous with the first transparent layer, the second transparent layer being patterned with apertures that penetrate completely through it;

the refractive index at the wavelength $\lambda$ of the substrate being substantially equal to those of the first and second transparent layers at the wavelength $\lambda$, such that optical reflections of the optical radiation at the interface of the substrate and the first transparent layer and at the interface of the first and second transparent layers are insubstantial (that is, any optical reflections do not degrade the image formed on the photoresist layer 101 (FIG. 1) by an undesirable amount).

By virtue of suitable choices of the first and second materials for the bottom and top transparent layers, respectively, patterning of the top layer (by anisotropic etching) is facilitated. Also, by means of suitable choices of materials both for the substrate and for the first and second transparent layers, a desirable etching end-point detection during subsequent mask repair can be provided by the resulting interfaces of the first and second transparent layers and of the first transparent layer and the substrate, without the need for the presence of either of the intervening etch-stopping layers 7 and 9 of the prior-art structure 200.

In this structure it is also advantageous, for the purpose of mask repair, that the structure further comprises:

a recess region (e.g., 32) penetrating entirely through the second and the first layers, or a first indentation region (e.g., 51) penetrating through a first thickness of the first layer and a second indentation region (e.g., 54) penetrating through a second thickness of the second layer, or a first indentation region penetrating through a first thickness of the first layer, a second indentation region penetrating through a second thickness of the second layer, and a recess region (e.g., 52) penetrating entirely through the second and first layers and through a thickness of the substrate equal to the first thickness.

In this way, one or more of the aforementioned shortcomings of the prior art can be mitigated, even if the mask structure is repaired with respect to either a defect region (e.g., 22) in the initial form of an indentation located on the top transparent layer or a defect region (e.g., 21) in the initial form of excess material located on the bottom transparent layer, or with respect to both such defect regions. In some embodiments, the substrate and the second layer have essentially the same chemical composition.

In this structure it is also advantageous that the total phase shift imparted to the optical radiation of wavelength $\lambda$ by the bottom plus top transparent layers (in regions where the top layer is superposed on the bottom layer) is equal to $2p\pi$, where p is an integer.

In this structure it is also advantageous that the substrate is essentially a fluoride or an oxide (including a mixture of oxides), that the second layer is essentially an oxide, and that the first layer is essentially a fluoride or an oxide.

It is also advantageous that the oxides are essentially silicon dioxide, aluminum oxide, or a mixture of them, and that the fluoride is essentially calcium fluoride or magnesium fluoride.

In another embodiment this invention provides a method for making a phase-shifting lithographic mask structure, for use in an optical lithographic system utilizing optical radiation of wavelength $\lambda$, comprising the steps of:

(a) providing a transparent substrate having a major surface;

(b) forming a first transparent layer of first material that is chemically different from that of the substrate, located on and contiguous with the major surface;

(c) forming a second transparent layer of second material that is chemically different from that of the first material, located on and contiguous with the first transparent layer, the second transparent layer being patterned with apertures that penetrate completely through it.

It is also advantageous that the method further comprises the step of forming:

a recess region penetrating entirely through the second and the first layers, or a first indentation region penetrating through a first thickness of the first layer and a second indentation region penetrating through a second thickness of the second layer, or a first indentation region penetrating through a first thickness of the first layer, a second indentation region penetrating through a second thickness of the second layer, and a recess region penetrating entirely through the second and first layers and through a thickness of the substrate equal to the first thickness, the substrate and the second layer having essentially the same chemical composition.

In this method it is also advantageous that the substrate is essentially a fluoride or an oxide (including a mixture of oxides), that the second layer is essentially an oxide, and that the first layer is essentially a fluoride or an oxide.

In this method it is also advantageous that the oxides are essentially silicon dioxide, aluminum oxide, or a mixture of them, and that the fluoride is essentially calcium fluoride or magnesium fluoride.

In yet another embodiment, this invention provides a photolithographic method, including making the phase-shifting mask structure in accordance with the foregoing followed by the steps of: (1) directing the optical radiation comprising the prescribed wavelength onto the phase-shifting mask structure, while focusing the radiation propagating through the phase-shifting mask structure onto a photoresist layer located on a workpiece, whereby an optical image of the mask structure is formed on the photoresist layer;

(2) developing the photoresist layer, whereby a feature is formed therein in accordance with the image of the mask; and (3) transferring into the workpiece the feature in the photoresist layer.

BRIEF DESCRIPTION OF THE DRAWINGS

Only for the sake of clarity, none of the drawings is to scale. Elements that are similar or the same in different Figures are denoted by the same reference numerals.

DETAILED DESCRIPTION

Figure 3:
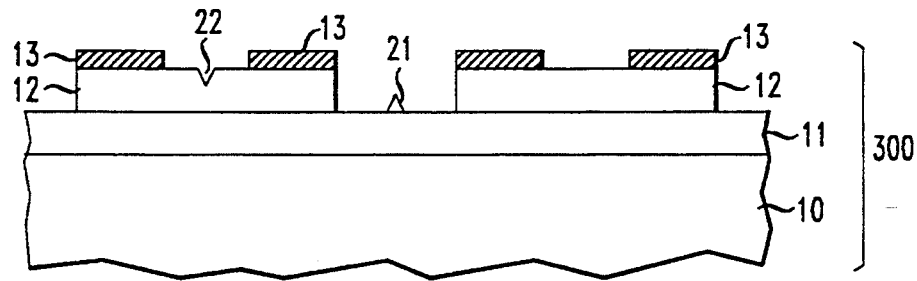
FIGS. 3–6 are cross-sectional elevational views of various stages of a phase-shifting mask structure as it is being repaired in accordance with a specific embodiment of the invention.
Figure 6:
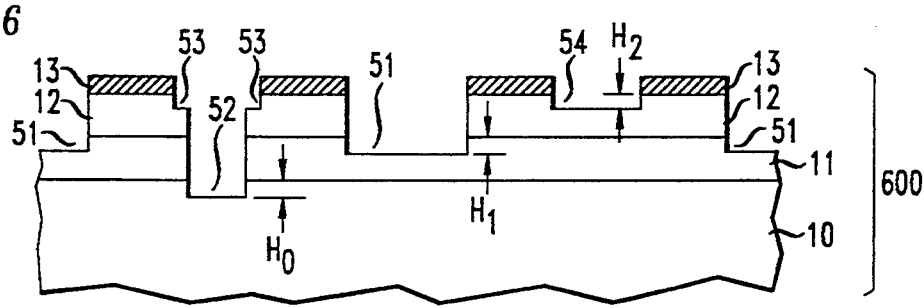

A phase-shifting mask structure 300 (FIG. 3) in accordance with an embodiment of the invention is to be repaired, in order to form a repaired phase-shifting mask structure 600 (FIG. 6) for use as the reticle in the optical system 100. This structure 300 differs from the structure 200 in that the etch-stopping layers 6 and 8 are omitted and the (unpatterned) bottom phase-shifting layer 11 is chemically different from both the substrate and the (patterned) top phase-shifter layer 12. Nevertheless, it is important that the refractive indices at the optical wavelength $\lambda$ of the substrate 10 and of both bottom and the top phase-shifting layers 11 and 12 be mutually at least approximately equal at the wavelength $\lambda$, in order to prevent undesirably large amplitude optical reflections either at the interface between the substrate 10 and the bottom phase-shifting layer 11 or at the interface between the bottom and top phase-shifting layers 11 and 12. Also, the (uniform) thicknesses of the bottom and the top phase-shifting layers 11 and 12 respectively, typically are at least approximately equivalent to optical phase shifts of $\phi_1 = (2m+1)\pi$ and $\phi_2 = (2n+1)\pi$ at the optical wavelength $\lambda$, where m and n are integers, preferably both equal to zero. More important, the sum of these phase shifts $(\phi_1 + \phi_2)$ should be equal to $2p\pi$, where p is an integer.

For example, the following table indicates sets of choices of materials:

| Substrate 10 | Bottom Layer 11 | Top Layer 12 |
| --- | --- | --- |
| Quartz | $MgF_2$ | $SiO_2$ |
| Quartz | $CaF_2$ | $SiO_2$ |
| Quartz | $xSiO_2 + (1 - x) Al_2O_3$ | $SiO_2$ |

Typically, x is in the approximate range of between 0.3 and 0.95 by molecular number. The top layer 12 of (pure) $SiO_2$ can be deposited by means of chemical vapor deposition (CVD); whereas the bottom layer of (the mixture) $xSiO_2 + (1-x)Al_2O_3$, or of (the pure) $MgF_2$, or of (the pure) $CaF_2$ can be deposited by means sputtering from suitable targets. The top and bottom layers are advantageously, as indicated, different in their respective chemical compositions, in order to enable end-point etching detection, as by detection secondary ions or secondary electrons, or etch-stopping during patterning of the top layer 12.

The bottom phase-shifting layer 11 typically has a defect region 21 (FIG. 3) in the form of excess material of the top phase-shifting layer 12; whereas the top phase-shifting layer 12 has a defect region 22 in the form of an indentation. Although the defect regions 21 and 22 are both depicted in FIG. 3 as having triangular shapes, other shapes are possible independently for each of them. Typically, the location each of the defect regions is detected by means of a two-dimensional scanning optical microscope.

Figure 4:
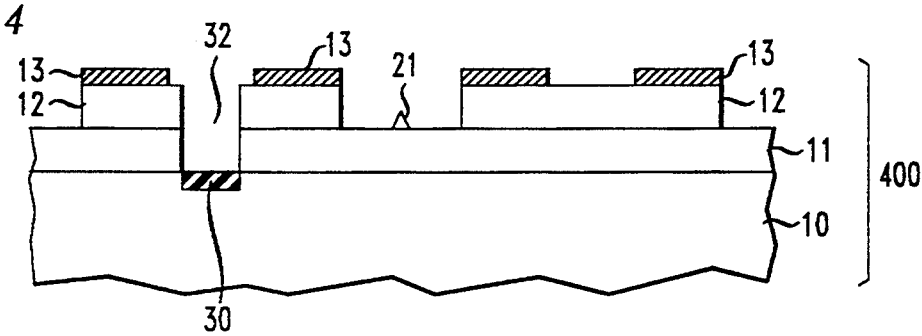

In order to remove the defect region 22, a focused gallium ion beam (not shown) is directed point-by-point at this defect region (as well as perhaps a surrounding neighborhood) but not at the defect region 21 (or at its surrounding neighborhood). This beam thus forms, by the process of ion milling, a recess region 32 penetrating entirely through the top and bottom phase-shifting layers 12 and 11, respectively, down to the top surface of the substrate 10. This ion milling process is immediately terminated as soon as the detected chemical by-products, or secondary ions or electrons, of the process begin to shift from those known to be emitted by the material of the bottom phase-shifting layer 11 to those known to be emitted by the material of the substrate 10, in order to guard against significantly penetrating the top surface of the substrate 10 during the ion milling process. Also, it is advantageous that the ion milling rate through the material of the substrate 10 is significantly lower than the rate through the material of the bottom layer 11, to further guard against the top surface of the substrate 10 being significantly penetrated by the ion milling process. In this way the structure 400 (FIG. 4) is obtained. Because of the gallium ions contained in the ion beam, in this structure 400 a nontransparent stained region 30—located in the region underlying the areas where the ion beam was directed—has been formed. It can be removed later. At any rate, the ion beam has thus produced a recess region 32 cutting through an area portion of the top and bottom phase-shifting layers 12 and 11, respectively.

Figure 5:
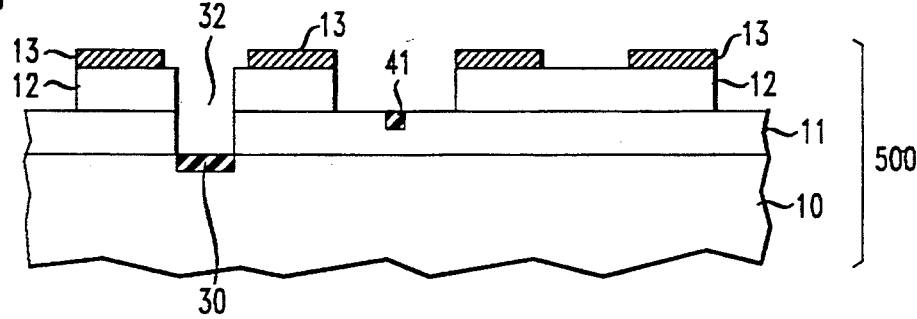

Next, the focused gallium ion beam is directed at the defect region 21, in order to remove it by ion milling. This ion milling is terminated as soon as the detected by-products, or the secondary ions or electrons, of the milling process begin to shift from those known to be emitted by the material of this defect region 21 to those known to be emitted by the material of the bottom phase-shifting layer 11. Thus, the resulting ion milling removes the defect region 21—again, however, leaving another nontransparent stained region 41 in the resulting structure 500 (FIG. 5).

Figure 1:
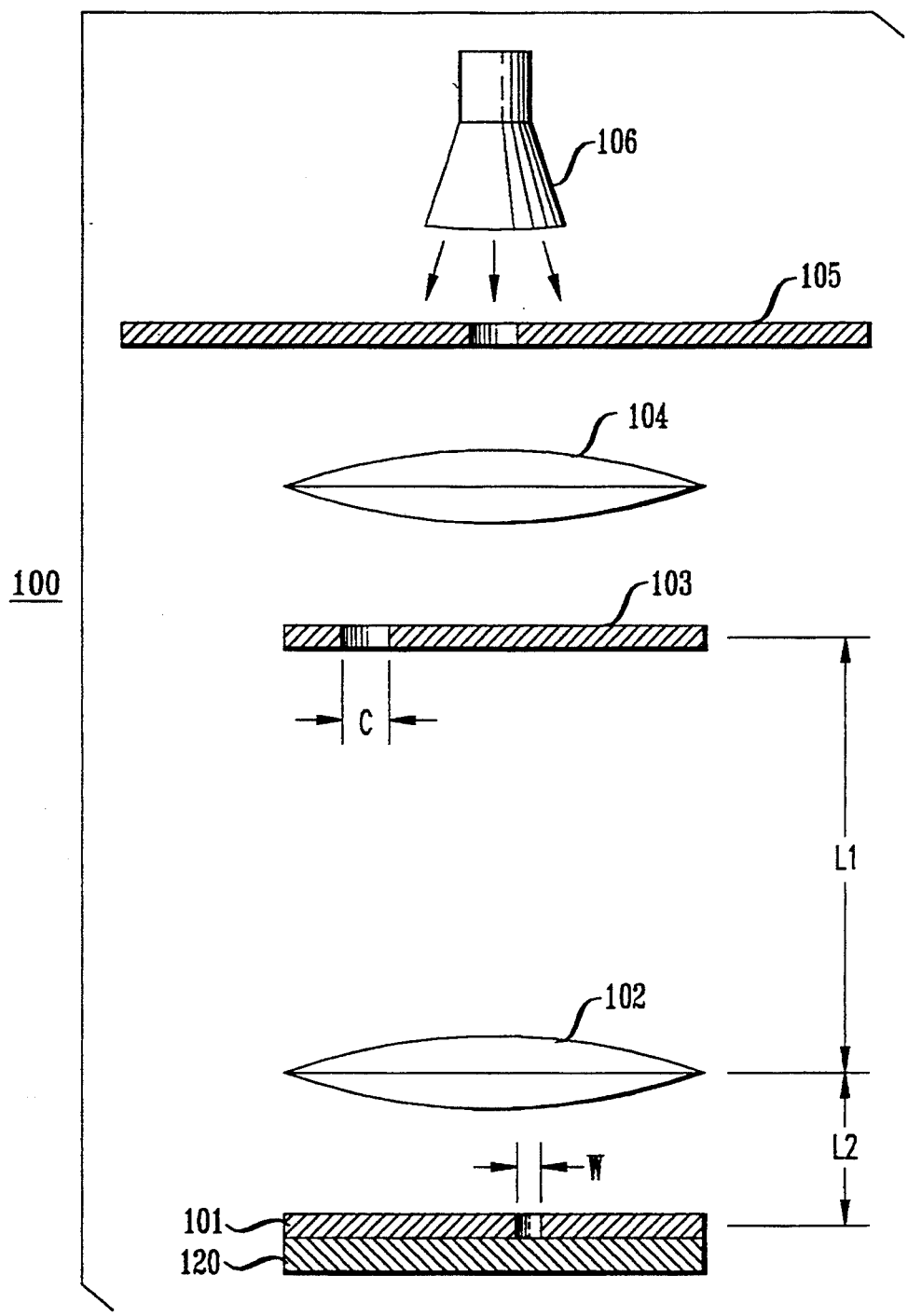
FIG. 1 is a diagram of an optical lithographical system useful in explaining the principles and of this invention.
Figure 2:
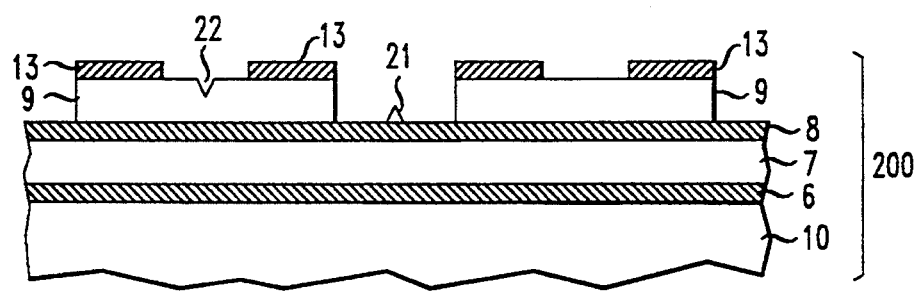
FIG. 2 is a cross-sectional elevational view of a phase-shifting mask structure in accordance with prior art.

The structure 500, despite the presence of the stained regions 30 and 41, is thus a repaired version of the original structure 300 and can be used as the reticle 103 in the system 100 (FIG. 1) especially if the ion beam is such as not to produce a degree of staining that undesirably degrades optical performance of the structure 500. When used as the reticle 103 in the system 100, the phase-shifting mask structure 500 is oriented typically with its substrate 10 being located closer to the optical source 106 than its patterned chromium layer 13. On the other hand, if it is desired to remove the stained regions 30 and 41, and thus produce a stain-free phase-shifting mask structure 600 (FIG. 6), a thickness equal to $H_2$ is to be removed both from the top phase-shifting layer 12, a thickness equal to $H_o$ from the substrate 10, and a thickness equal to $H_1$ is to be removed from the bottom phase-shifting layer 11. Typically $H_o$ and $H_1$ (as well as $H_2$) are of the order to 20 nm. Advantageously, both $H_0$ and $H_1$ are greater than the depths of the respective stained regions 30 and 41. Advantageously also, $H_0$, $H_1$, and $H_2$ at least approximately satisfy the mutual relationships:

$$H_o)n_o-1)=H_1(n_1-1)=H_2(n_2-1) \quad (1)$$

where $n_0$ is refractive index of the substrate 10, and $n_1$ and $n_2$ are the refractive indices of the bottom or top phase-shifting layers 11 and 12, respectively—the refractive indices $n_0$, $n_1$, and $n_2$ all being measured at the wavelength λ to be used in the system 100. In this way, not only are the stained regions 30 and 41 removed, but the added phase-shifts produced by the resulting added indentations 51, 52, 53 and 54 formed, respectively, in the bottom phase-shifting layer 11, the substrate 10, and the top phase-shifting layer 12 also are mutually compensated.

In order to remove the stained regions 30 and 41 and thus produce the stain-free structure 600, by way of example, the thickness $H_o$ is removed from respective exposed areas of the substrate 10 and of the top phase-shifting layer 12—such as by means of a wet or dry etching process that does not significantly etch the bottom phase-shifting layer 11. (Here the term "not significantly" means that any departure from not etching any of the bottom phase-shifting layer 11 does not introduce any intolerable defects in the optical image formed in the photoresist layer 10, in the system 100.) For example, if the materials of the substrate 10 and of the top phase-shifting layer are both oxides that etch at the same rate, say silicon dioxide (quartz, or CVD silicon dioxide), and the material of the bottom phase-shifting layer 11 is a fluoride, say calcium or magnesium fluoride, then the etchant can comprise (wet) hydrofluoric acid or a (dry) fluorinated gas mixture of $CHF_3$, $CF_4$, and $O_2$. Thereby the indentations 52, 53 and 54 are formed—all having the depth $H_o$. The actual value of the depth $H_o$ is then measured, or is known (by experience) from the etching time duration and the etching conditions. In this way, the stained region 30 is removed.

Next, the depth (thickness) $H_1$, is calculated from the above equation (1). Then this known (desired) thickness $H_1$ is anisotropically removed from exposed areas of the bottom phase-shifting layer 11—such as by means of an etching process that does not significantly etch the substrate 10 or the top phase-shifting layer 12. For example, in cases of the above-mentioned materials, the etchant can comprise hydrochloric acid. This etching of the bottom phase-shifting layer 11 is terminated when the (desired) depth $H_1$ of the resulting indentation 51 is attained—as actually measured or as known (by experience) from the etching time duration and the etching conditions. In this way the stained region 41 is removed, and at the same time the added phase shifts produced by removal of the stained regions 30 and 41 all compensate one another. The structure 600 can then advantageously be used as the reticle 103 in the system 100 (FIG. 1), again typically with the substrate 10 being located closer to the optical source 106 than the patterned chromium layer.

Although the invention has been described in detail with respect to a specific embodiment, various modifications can be made without departing from the scope of the invention. For example, the order of sequence of removal of the stained regions 30 and 41 can be reversed. Also, it is not necessary that the etching process that is used to remove the stained region 30 does not significantly remove any of the material of the bottom phase-shifting layer 11, so long as the ratios of $H_2$ to $H_1$ to $H_o$ in the final structure 600 satisfy equation 1. Similarly, it is not necessary that the etching process that is used to remove the stained region 41 does not significantly remove any of the material of the substrate 10 or of the top phase-shifting layer 12, again so long as the ratios of $H_2$ to $H_1$ to $H_o$ in the final structure 600 satisfy equation 1. Finally, instead of the optical source 106 in the system 100, an X-ray source can be used in conjunction with suitable modifications of the other elements located between the source 106 and the (X-ray sensitive) photoresist layer 101, as known in the art.

I claim:

1. A phase-shifting lithographic mask structure, having a feature to be transferred to a workpiece in an optical lithographical system utilizing optical radiation of wavelength λ, comprising:

(a) a transparent substrate having a major surface;

(b) a first transparent layer of first material that is chemically different from that of the substrate, located on and contiguous with the major surface;

(c) a second transparent layer of second material that is chemically different from that of the first material, located on and contiguous with the first transparent layer, the second transparent layer being patterned with apertures that penetrate completely through it;

the refractive index at the wavelength $\lambda$ of the substrate being substantially equal to those of the first and second transparent layers at the wavelength $\lambda$, such that optical reflections of the optical radiation at the interface of the substrate and the first transparent layer and at the interface of the first and second transparent layers are insubstantial.

2. A structure in accordance with claim 1 further comprising:
a recess region penetrating entirely through the second and the first layers, or
a first indentation region penetrating through a first thickness of the first layer and a second indentation region penetrating through a second thickness of the second layer, or
a first indentation region penetrating through a first thickness of the first layer, a second indentation region penetrating through a second thickness of the second layer, and a recess region penetrating entirely through the second and first layers and through a thickness of the substrate equal to the first thickness, the substrate and the second layer having essentially the same chemical composition.

3. The structure of claim 2 in which at least a superposed portion of each of the first and second layers has a uniform thickness, and the superposed portions impart a total phase shift that is equal to $2p\pi$ radian to the optical radiation when propagating through the structure, where p is a positive integer.

4. The structure of claim 1 in which at least a superposed portion of each of the first and second layers has a uniform thickness and imparts a total phase shift equal to $2p\pi$ radian to the optical radiation when propagating through the structure, where p is a positive integer.

5. A method of making a phase-shifting lithographic mask structure, having a feature to be transferred to a workpiece in an optical lithographic system utilizing optical radiation of wavelength $\lambda$, comprising the steps of:
(a) providing a transparent substrate having a major surface;
(b) forming a first transparent layer of first material that is chemically different from that of the substrate, located on and contiguous with the major surface;
(c) forming a second transparent layer of second material that is chemically different from that of the first material, located on and contiguous with the first transparent layer, the second transparent layer having apertures that penetrate completely through it.

6. A photolithographic method, including making the mask structure in accordance with claim 5, followed by the steps of:
(1) directing the optical radiation comprising the prescribed wavelength onto the phase-shifting mask structure, while focusing the radiation propagating through the phase-shifting mask onto a photoresist layer located on a workpiece, whereby an optical image of the feature of the mask structure is formed on the photoresist layer;
(2) developing the photoresist layer, whereby a feature is formed therein in accordance with the image of the mask structure; and
(3) transferring into the workpiece the feature in the photoresist layer.

7. The method of claim 5 further comprising the step of forming:
a recess region penetrating entirely through the second and the first layers, or
a first indentation region penetrating through a first thickness of the first layer and a second indentation region penetrating through a second thickness of the second layer, or
a first indentation region penetrating through a first thickness of the first layer, a second indentation region penetrating through a second thickness of the second layer, and a recess region penetrating entirely through the second and first layers and through a thickness of the substrate equal to the first thickness, the substrate and the second layer having essentially the same chemical composition.

8. A photolithographic method, including making the mask structure in accordance with claim 7, followed by:
(1) directing the optical radiation comprising the prescribed wavelength onto the phase-shifting mask structure, while focusing the radiation propagating through the phase-shifting mask onto a photoresist layer located on a workpiece, whereby an optical image of the feature of the mask structure is formed on the photoresist layer;
(2) developing the photoresist layer, whereby the feature is formed therein in accordance with the image of the mask structure; and
(3) transferring into the workpiece the feature in the photoresist layer.

9. A photolithographic method, including making the mask structure in accordance with claim 7, in which at least a superposed portion of each of the first and second layers has a uniform thickness, and in which the superposed portion imparts a total phase shift that is equal to $2p\pi$ radian to the optical radiation when propagating through the structure, where p is a positive integer, followed by
(a) directing the optical radiation comprising the prescribed wavelength onto the phase-shifting mask structure including the superposed portion, while focusing the radiation propagating through the phase-shifting mask onto a photoresist layer located on a workpiece, whereby an optical image of the mask is formed on the photoresist layer;
(b) developing the photoresist layer, whereby the feature is formed therein in accordance with the image of the mask; and
(c) transferring into the workpiece the feature in the photoresist layer.

* * * * *